United States Patent [19]

Carobolante

[11] Patent Number: 5,296,857
[45] Date of Patent: Mar. 22, 1994

[54] DIGITAL TO ANALOG CONVERTER WITH PRECISE LINEAR OUTPUT FOR BOTH POSITIVE AND NEGATIVE DIGITAL INPUT VALUES

[75] Inventor: Francesco Carobolante, Phoenix, Ariz.

[73] Assignee: SGS-Thomson Microelectronics, Inc., Carrollton, Tex.

[21] Appl. No.: 843,578

[22] Filed: Feb. 28, 1992

[51] Int. Cl.$^5$ ............................................... H03M 1/66
[52] U.S. Cl. ...................................... 341/144; 341/127
[58] Field of Search ............... 341/144, 127, 153, 141, 341/122, 154, 146, 155

[56] References Cited

U.S. PATENT DOCUMENTS 3,705,359 12/1972 Kappes ................................. 341/143
3,924,229 12/1975 Liu ....................................... 341/127
4,410,880 10/1983 Zaborowski ......................... 341/127

OTHER PUBLICATIONS

"Analog to Digital Conversion Handbook", Analog Devices, Inc., 1986, pp. 207-211 and pp. 183-186.

Primary Examiner—Brian K. Young
Attorney, Agent, or Firm—Richard A. Bachand; Lisa K. Jorgenson; Richard K. Robinson

[57] ABSTRACT

A circuit and method for converting a digital number to an analog output signal, wherein the most significant bit or "sign" bit of the digital number is used for switching the accumulated currents of the other data bits to a chain of operational amplifiers employing feedback resistors for conversion into an output voltage of magnitude and sign corresponding to the input digital number. A decoding circuit and method enables the circuit to present an output voltage corresponding to the two's—complement of the input digital number.

23 Claims, 2 Drawing Sheets

DIGITAL TO ANALOG CONVERTER WITH PRECISE LINEAR OUTPUT FOR BOTH POSITIVE AND NEGATIVE DIGITAL INPUT VALUES

BACKGROUND OF THE INVENTION

1. Field of the Invention

This invention relates to improvements in methods and circuitry for converting digital numbers to analog output signals, and more particularly to improvements in methods and circuitry for converting a signed digital number to an analog output signal while maintaining an output offset voltage typically equal to the input offset voltage of only one operational amplifier to produce a precise linear output for both positive and negative digital input values.

2. Description of the Prior Art

This invention pertains to digital to analog (D/A) conversion in which an input number is a binary-coded or two's—complement digital number which is considered to be "bipolar", representing either a positive or negative number with the most significant bit (MSB) of the digital word being the "sign" bit. An analog ground, or zero voltage reference signal, is usually provided by the user external to the digital to analog converter, and the internal conversion in the D/A device may be generated based on a different reference voltage level. Therefore, it is often necessary to convert the output of the D/A converter to the reference provided by the user. This unfortunately entails the generation of offset voltages created by level-shifting and amplification which are difficult to minimize, and therefore creates an undesirable error in the output voltage for a given input number. This is unsatisfactory because precision is usually important in D/A conversion.

Previously, techniques have been developed which employ the generation of positive and negative currents which are fed to a single operational amplifier connected as a current to voltage converter. However, the accuracy (symmetry across the reference voltage level for given positive and negative input codes of equal magnitude) has been unsatisfactory due to the difficulty of accurately mirroring positive into negative current. Such techniques generally require trimming, which is a complicated and expensive process, especially for integrated semiconductor devices.

Another technique which has been used is a "unipolar" conversion in which currents are not mirrored into negative currents, but rather are sent to the current to voltage converter in their original state. A gain and level shifting stage then used to convert the level to form a "bipolar" output wherein both positive and negative output voltages (with respect to the reference) may occur. However, this technique creates undesirable offsets generated by the gain stage and the common mode rejection of the level shifting stage.

What is needed is a way to minimize the output offset voltage of the operational amplifier while accurately matching the positive and negative amplification of digital numbers.

SUMMARY OF THE INVENTION

In light of the above, therefore, it is an object of the invention to provide an improved apparatus and method for converting digital numbers to analog output signals wherein both positive and negative analog output signals corresponding to positive and negative digital numbers may be accurately and precisely generated.

It is another object of the invention to provide an improved apparatus and method of the type described which uses circuitry and methods for switching weighted currents representing positive binary numbers to a first operational amplifier and weighted currents representing negative binary numbers to a second operational amplifier for conversion into proportional voltage levels.

It is another object of the invention to provide an improved apparatus and method of the type described for minimizing the output offsets caused by level shifting and amplification and, therefore, to minimize the output voltage error per given input code.

It is another object of the invention to provide an improved apparatus and method of the type described which will maintain an output offset voltage equal to the equivalent input offset voltage of only one of the operational amplifiers, independent of the gain (output voltage range).

It is another object of the invention to provide an improved apparatus and method of the type described which does not require trimming procedures or circuitry to accurately produce analog signals of either polarity.

It is still another object of the invention to provide an apparatus and method of the type described which is suitable for integration onto a single integrated circuit device.

It is yet another object of the invention to provide an improved apparatus and method of the type described which will achieve nonlinearities of magnitude smaller than the least significant bit.

These and other objects, features, and advantages of the invention will be apparent to those skilled in the art from the following description of the invention, when read in conjunction with the accompanying drawings and appended claims.

In its broad aspect, the invention presents a circuit for converting a digital number having a positive or negative sign to an analog output signal. The circuit includes switching circuitry for producing weighted currents representing bits that have a predetermined state for combination into a sum current, conversion circuitry for converting said sum current into a voltage with a polarity with respect to a reference voltage corresponding to the sign of said digital number, and switching circuitry for selectively delivering the sum current to a selected input of said conversion circuitry depending on the sign of the digital number for the purpose of determining the polarity with respect to said reference voltage of the analog output signal.

In another broad aspect of the invention, a method for converting a signed digital number to an analog output signal is presented. In accordance with the method, weighted bit currents are produced representing the bits of the digital number for combination into a sum current, and a circuit is provided for converting the sum current to an output voltage that has a polarity with respect to a reference voltage determined by the sign of the digital number. The sum current is selectively delivered to a selected input of the circuitry for converting the sum current into a voltage depending on the sign of the digital number for the purpose of determining the polarity with respect to said reference voltage of the analog output signal.

BRIEF DESCRIPTION OF THE DRAWINGS

The invention is illustrated in the accompanying drawings, in which.

DETAILED DESCRIPTION OF THE PREFERRED EMBODIMENT

Figure 1:
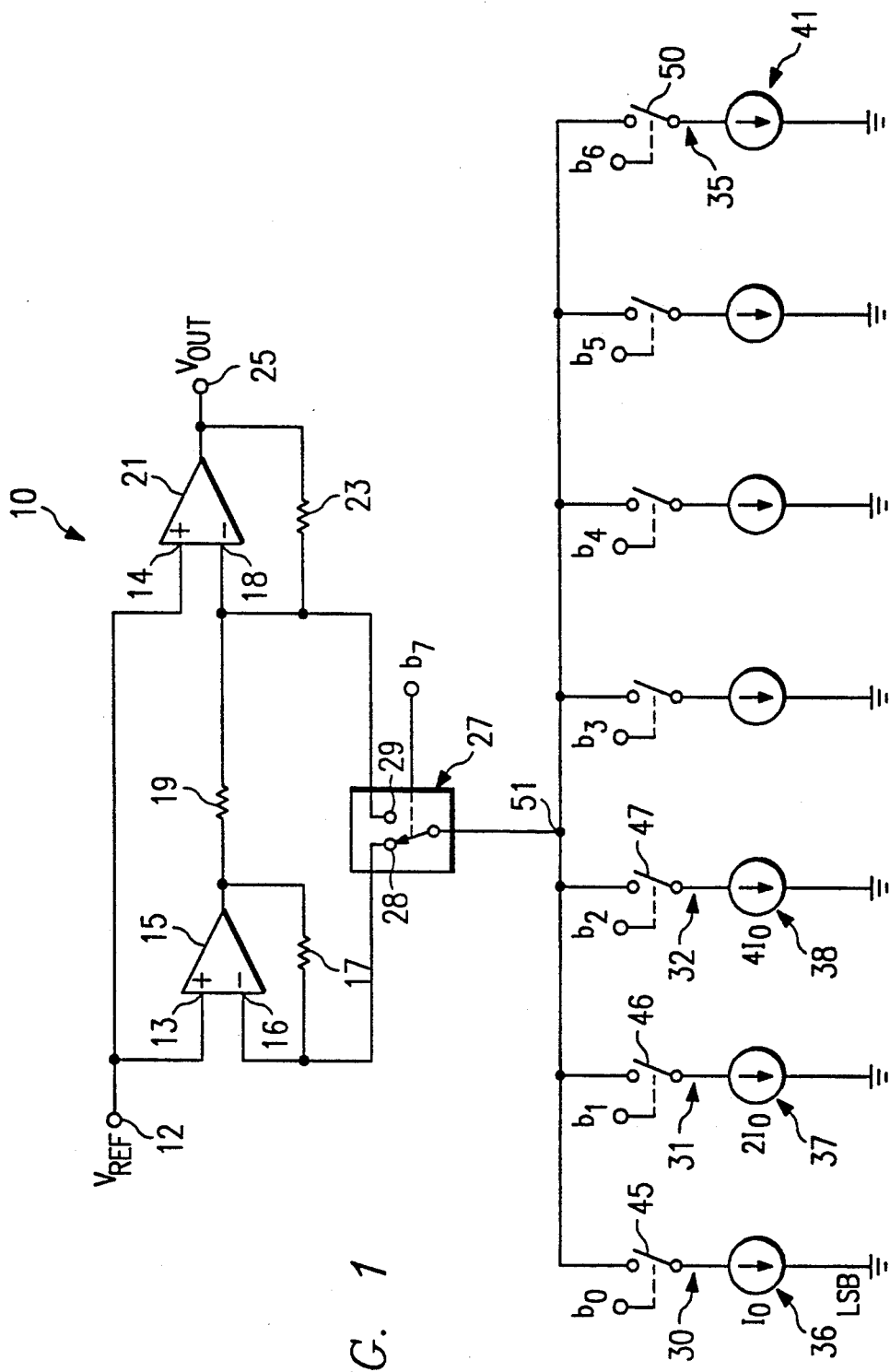
FIG. 1 is an electrical schematic diagram of a digital to analog conversion system incorporating apparatus in accordance with one embodiment of the invention, utilizing amplitude plus sign coding.

An electrical schematic diagram of a digital to analog converter 10 in which the apparatus and method in accordance with a preferred embodiment of the invention is incorporated is shown in FIG. 1. This digital to analog converter 10 has input lines $b_0 \ldots b_7$ to receive a standard binary input number. Although the digital to analog converter 10 can be constructed of discrete components, preferably, it is integrated onto a single integrated circuit.

The binary input number received on the parallel input lines $b_0 \ldots b_7$ may represent either a positive or negative digital number. The sign of the number is indicated by the "sign bit", which typically is the most significant bit (MSB), and which appears on the input line $b_7$. The data lines 30, 31, 32, ... 35 carry "binary-weighted" currents, or weighted bit currents, the magnitude of the current on each line of which corresponding to the value, or power, of the binary bit applied to the respective input lines $b_0 \ldots b_6$. To accomplish the weighting, current sources 36, 37, 38, ... 41 generate particular values of current on the respective input lines representing the least significant bit (LSB) ($2^0$), twice that value on the next most significant bit ($2^1$), four times that value on the next ($2^2$), and so on.

The currents provided by the current sources 36–41 are controlled by switches 45, 46, 47, ... 50, which are typically transistor switches, but which may be realized by any appropriate type of switch. In the embodiment illustrated, a logical "1" on one of the input lines causes its respective one of switches 45, 46, 47, ... 50 to close; a logical "0" on one of the input lines causes its respective one of switches 45, 46, 47, ... 50 to open. Thus, the current appearing at the node 51 will be the sum of the currents selectively connected thereto by the operation of the selected ones of the switches 45–50. It will be appreciated that although separate switches 45, 46, 47, ... 50 and current generators 36, 37, 38, ... 41 are shown, both the switch and current generator in each path may be realized by one set of appropriately sized transistors or equivalent devices.

The sign bit, i.e., the most significant bit on the line $b_7$, activates a switch 27 that selectively directs the currents summed at the node 51 to the inverting input 16 of a first operational amplifiers 15 when the sign bit is negative, or to the inverting input 18 of the operational amplifier 21 when the sign bit is positive.

The operational amplifiers 15 and 21 are connected in a transresistance configuration as current to voltage converters, where the second operational amplifier 21 is also acting as a buffer, providing a low-impedance output. A reference voltage 12 is impressed on the noninverting inputs 13 and 14 of the operational amplifiers 15 and 21; as noted previously, since this voltage may be different from the user-supplied analog ground (zero reference signal), level-shifting may be necessary.

In operation, when the sign bit on input terminal $b_7$ is a logical "0" (representing a negative binary input number), the left pole 28 of the switch 27 is selected, and the analog output 25 of the circuit goes to a negative voltage proportional to the sum current on the node 51. When the sign bit is a logical "1" the right pole 29 is selected and the output 25 goes to a positive voltage proportional to the sum current on the node 51. The most negative output voltage will occur when the binary input, exclusive of the sign bit, is all "1's"; the most positive output voltage will occur when the binary input, is also all "1's". The null-output (reference voltage) will occur when all the bits besides the sign bit are "0's", independent of the value of the sign bit (thus obtaining an amplitude plus sign representation of the input code).

The two operational amplifiers 15 and 21 are configured with feedback resistors 17 and 23 to minimize the output error voltage. Although the circuit can be realized with resistors 17 and 23 being of substantially equal value, the closer to equal they can be made the better the precision that can be realized in the operation of the circuit. In addition, the signal from the first operational amplifier 15 is coupled by a resistor 19 to the inverting input 18 of the second operational amplifier 21. The configuration is such that for a no-input condition the output offset voltage is typically no more than the equivalent input offset voltage of a unity-gain configuration of only one of the two operational amplifiers. In fact, if the two operational amplifiers are identical and have the same input offset voltage the output offset is exactly equal to the input offset voltage, regardless of the gain (output range of the digital to analog converter). Also, if the switching of the currents is lossless, for example through the use of a CMOS device for switch 27, the accurate matching of positive and negative output voltages corresponding to positive and negative digital numbers is only limited by the precision of the operational amplifier feedback resistors 17 and 23, provided the open loop gain of the operational amplifiers 15 and 21 is sufficiently high.

Figure 2:
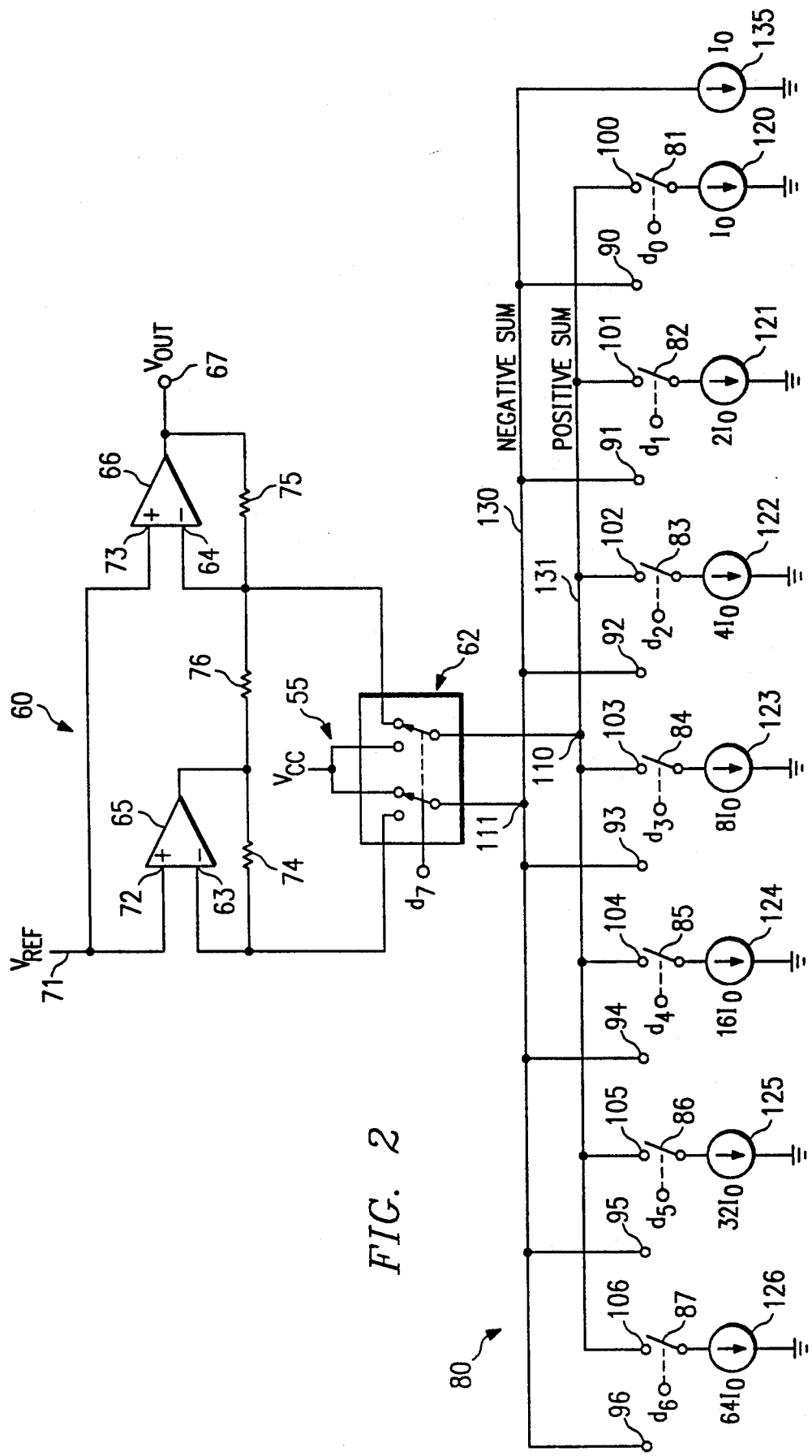
FIG. 2 is an electrical schematic diagram of a digital to analog conversion system for a two's-complement configuration incorporating apparatus in accordance with another embodiment of the invention.

An electrical schematic diagram of a digital to analog converter 60 in which the apparatus and method in accordance with another preferred embodiment of the invention is incorporated is shown in FIG. 2. As with the circuit embodiment described above with reference to FIG. I, the digital to analog converter 60 can be constructed of discrete components; however, preferably it is integrated onto a single integrated circuit device adapted for connection within a larger system. The input to the circuit 60 is a binary number presented on the parallel data lines $d_0-d_7$. As in FIG. 1, the currents are weighted according to their respective binary values, with the state of the most significant bit $d_7$ controlling a switch 62 that routes or "steers" the summed current either to the inverting input 63 or 64 of respective operational amplifier 65 or 66 for conversion to an output voltage 67.

As shown in FIG. 2, the amplifiers 65 and 66 are serially connected in a chain configuration, with a reference voltage 71 applied to the noninverting inputs 72 and 73 of the respective operational amplifiers 65 and 66. Feedback resistors 74 and 75 are connected between the outputs and inverting inputs of each of the amplifiers 65 and 66. Although the circuit can be realized with resistors 74 and 75 being of substantially equal value, the closer to equal they can be made the better the precision that can be realized in the operation of the circuit. Another resistor 76 couples the output of the first operation amplifier 65 to the second operational amplifier 66. However, this D/A converter circuit 60 differs from the embodiment described above with reference to FIG. 1 in that the analog voltage output will be an analog signal corresponding to the two's-complement representation of the input binary number. This particular embodiment is particularly useful in modern electronics and computer applications, since most computers currently use the two's-complement system for computations.

In order to perform the conversion from standard binary to two's-complement, it is necessary to invert all the binary values and add a "1" to the least significant bit. A decoding circuit 80 is provided to perform this conversion and a current weighting function for negative binary input numbers, as well as to perform a current weighting function for positive binary input numbers. The decoding circuitry 80 includes switches 81-87, which may be realized using transistors or other switching devices, that are operated to switch to the left poles 90-96 if the state of the respective binary bit on inputs $d_0$-$d_6$ is a logic "0", and to switch to the right poles 100-106 if the state of the respective binary bit on inputs $d_0$-$d_6$ is a logic "1". Each of the switches has a current source connected in series with it, having a current weighted according to the bit position to which the switch 81-87 corresponds. For example, to accomplish the weighting, current sources 120-126 generate particular values of current on the respective input lines representing the least significant bit (LSB), twice that value on the next most significant bit, four times that value on the next, and so on.

The switch 62 operates to route the bit currents summed on the nodes 110 and 111 as controlled by the most significant bit (sign bit) on the input terminal $d_7$. Thus, for example, when the sign bit on the input terminal $d_7$ is "1", indicating a negative number, the switch 62 connects the node 111 to the inverting input 63 of the operational amplifier 65 (and the node 110 to $V_{cc}$). On the other hand, when the sign bit on the input terminal $d_7$ is "0", indicating a positive number, the switch 62 connects the node 110 to the inverting input 64 of the operational amplifier 66, and connects the node 111 to $V_{cc}$. (Note that the sign bit convention for two's-complement is the reverse of the convention for straight binary numbers). The unused currents may be routed to a fixed potential if the operation of the generation circuits requires it to maintain linearity; however, this will not need to be done in every embodiment. For example, CMOS implementations will not require the currents to be so disposed of; FIG. 1 envisions such a situation. However, when linked bipolar transistors, for example, are used for the current sources the currents will need to be so disposed of, to prevent saturation of the transistors. Therefore, whether the need to deal with such currents will arise depends wholly on the particular technology used for constructing the circuit, and both FIGS. 1 and 2 may be implemented with or without current-shunting to $V_{cc}$ 55 as the situation requires.

In operation, when a negative input binary number is received, all bits having a value of "1" will have their respectively associated weighting currents connected via the right poles 100-106 and summed on node 110 to a $V_{cc}$ termination 55. All bits having a value of "0" will have their respectively associated weighting currents connected via the left poles 90-96 and summed on the node 111 to the inverting input 63 of the operational amplifier 65. In this way, the inversion is implemented, and the conversion to two's-complement is completed by adding a current from a current source 135 of magnitude equal to the least significant bit on the negative sum line 130. Thus, the analog output 67 will correspond to this two's-complement value.

When the sign bit is "0", indicating a positive number, the weighted currents representing bits having a value of logical "0" are routed through the left-hand poles 90-96 through the negative sum line 130 to be summed on node 111 and directed to the $V_{cc}$ termination 55. The weighted currents representing bits having a value of logical "1" are connected by the right-hand poles 100-106 to the positive sum line 131 to be summed on the node 110 and directed via the switch 62 to the inverting input 64 of the right-hand operational amplifier 66 for conversion into an analog output voltage 67 corresponding to the positive binary number on the input lines $d_0$-$d_7$.

It will be appreciated by those skilled in the art that other current-weighted decoding circuits can be equally advantageously employed in place of the weighting embodiments described above.

Although the invention has been described and understood with a certain degree of particularity, it is understood that the present disclosure has been made only by way of example and that numerous changes in the combination and arrangement of parts can be resorted to by those skilled in the art without departing from the spirit and scope of the invention, as hereinafter claimed.

I claim:

1. A circuit for converting a digital number having positive or negative sign to an analog output signal, comprising:
    transistor switches for producing weighted currents representing bits that have a predetermined state for combination into a sum current;
    operating amplifiers serially connected in a unity-gain configuration, each operational amplifier having feedback resistors for obtaining a precise output voltage, for converting said sum current into a voltage with a polarity with respect to a reference voltage corresponding to the signal of said digital number; and
    switching circuitry for selectively delivering the sum current to a selected input of said operational amplifiers depending on the sign of the digital number for the purpose of determining the polarity with respect to said reference voltage of the analog output signal.

2. The circuit of claim 1 wherein the feedback resistors have substantially equal resistance values.

3. The circuit of claim 2 wherein said feedback resistors have precisely the same resistance values.

4. The circuit of claim 1 wherein said transistor switches for producing weighted bit currents comprises a decoder circuit for providing a two's-complement decoded value for negative input digital values to said switching circuitry.

5. The circuit of claim 4 further comprising a termination for unused bit currents.

6. A circuit for converting a digital number having a plurality of bits including a sign bit to an analog output signal having positive and negative voltage values with respect to a reference voltage, comprising:

a weighting circuit for ascribing weighted currents to the bits of the digital number that have a predetermined state, and for developing sum currents comprising a sum of said weighted currents;

a first operational amplifier having inverting and non-inverting inputs and an output, and having a reference potential applied to said non-inverting input;

a first resistor connected between said inverting input and said output for providing feedback to said first operational amplifier;

a second operational amplifier having inverting and non-inverting inputs and an output, said inverting input connected to receive a signal from said output of said first operational amplifier, and having said reference potential applied to said non-inverting input;

a second resistor coupling the output of said first operational amplifier to the inverting input of the second operational amplifier;

a third resistor having a resistance value substantially equal to the resistance value of said first resistor connected between the output of said second operational amplifier and the inverting input of said second operational amplifier for providing feedback; and a switch, controlled by said sign bit, for switching said sum currents when the sign bit is a first logical state to the inverting input of said second operational amplifier to produce a voltage at the output of said second operational amplifier that is positive with respect to said reference potential, and for switching said sum currents when the sign bit is a second logical state to the inverting input of said first operational amplifier to produce a voltage at the output of said second operational amplifier that is negative with respect to said reference potential.

7. The circuit of claim 6 wherein the sign bit is the most significant bit in the digital number.

8. The circuit of claim 6 wherein the first logical state is a logical "1" and the second logical state is a logical "0".

9. The circuit of claim 6 wherein said weighting circuit comprises a decoder circuit for providing a two's-complement decoded value for input digital values to the switch for switching sum currents.

10. The circuit of claim 6 further comprising a termination for unused bit currents.

11. The circuits of claim 9 wherein said first, second and third resistors have precisely equal resistance values.

12. A method for converting a digital number having a plurality of bits including a sign bit to an analog output signal having positive and negative voltage values with respect to a reference, comprising:

providing a weighting circuit for ascribing weighted currents to the bits of the digital number that have a predetermined state, and for developing sum currents comprising a sum of said weighted currents;

providing a first operational amplifier having inverting and noninverting inputs and an output, and having a reference potential applied to said noninverting input;

providing a first resistor connected between said inverting input and said output for providing feedback to said first operational amplifier;

providing a second operational amplifier having inverting and noninverting inputs and an output, said inverting input connected to receive a signal from said output of said first operational amplifier, and having said reference potential applied to said non-inverting input;

providing a second resistor for coupling the output of said first operational amplifier to the inverting input of the second operational amplifier;

providing a third resistor having a resistance value substantially equal to the resistance value of said first resistor connected between the output of said second operational amplifier and the inverting input of said second operational amplifier for providing feedback; and providing a switch, controlled by said sign bit, for switching said sum currents when the signal bit is a first logical state to the inverting input of said second operational amplifier to produce a voltage at the output of said second operational amplifier that is positive with respect to said reference potential, and for switching said sum currents when the signal bit is a second logical state to the inverting input of said first operational amplifier to produce a voltage at the output of said second operational amplifier that is negative with respect to said reference potential.

13. The method of claim 12 wherein the sign bit is the most significant bit in the digital number.

14. The method of claim 12 wherein the first logical state is a logical "1" and the second logical state is a logical "0".

15. The method of claim 12 wherein said weighting circuit comprises a decoder circuit for providing a two's-complement decoded value for input digital values.

16. The method of claim 12 further comprising providing a termination for unused bit currents.

17. The method of claim 12 wherein said first resistor and said third resistor have precisely equal resistance values.

18. A method for converting a digital number having a positive or negative sign to an analog output signal, comprising the steps of:

producing weighted bit currents representing the bits of the digital number for combination into a sum current;

selectively delivering said sum current to a selected input of a converting circuit depending on said sign of said digital number; and converting said sum current into an output voltage by using said converting circuit, using operational amplifiers serially connected, having feedback resistors for obtaining a precise output voltage, in a transresistance configuration, said output voltage having a polarity which is based on a reference voltage, said output voltage forming the analog output signal.

19. The method of claim 18 wherein transistor switches are used for producing the weighted bit currents.

20. The method of claim 18 wherein said step of converting the sum current uses feedback resistors of substantially equal resistance values.

21. The method of claim 18 wherein said step of converting the sum current uses resistors of precisely equal values.

22. The method of claim 18 wherein the step of producing weighted bit currents comprises the step of generating a two's-complement decoded value for negative input digital values.

23. The method of claim 18 further comprising the step of providing a termination for unused bit currents.

* * * * *